(12) United States Patent
Li et al.

(10) Patent No.: US 11,355,703 B2
(45) Date of Patent: Jun. 7, 2022

(54) PHASE CHANGE DEVICE WITH INTERFACING FIRST AND SECOND SEMICONDUCTOR LAYERS

(71) Applicant: International Business Machines Corporation, Armonk, NY (US)

(72) Inventors: Ning Li, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 102 days.

(21) Appl. No.: 16/903,245

(22) Filed: Jun. 16, 2020

(65) Prior Publication Data

US 2021/0391535 A1   Dec. 16, 2021

(51) Int. Cl.
*H01L 45/00* (2006.01)
*G11C 13/00* (2006.01)

(52) U.S. Cl.
CPC .......... *H01L 45/1233* (2013.01); *H01L 45/06* (2013.01); *H01L 45/128* (2013.01);
(Continued)

(58) Field of Classification Search
CPC ....... H01L 45/06; H01L 45/128; H01L 45/14; H01L 45/1608; G11C 13/0004;
(Continued)

(56) References Cited

U.S. PATENT DOCUMENTS 7,888,165 B2   2/2011   Hampton
8,319,203 B2   11/2012  Hampton
(Continued)

FOREIGN PATENT DOCUMENTS

CN   101556986   10/2009

*Primary Examiner* — Jerome Leboeuf
(74) *Attorney, Agent, or Firm* — Daniel P. Morris; Lou Percello, Attorney, PLLC

(57) ABSTRACT

According to some embodiments of the present invention a phase change device (PCD) has a first and second semiconductor layer. The first semiconductor layer made of a first semiconductor material and has a first semiconductor thickness, a first interface surface, and a first electrode surface. The first interface surface and first electrode surface are on opposite sides of the first semiconductor layer. The first semiconductor material can transition between a first amorphous state and a first crystalline state at one or more first conditions. The second semiconductor layer is made of a second semiconductor material and has a second semiconductor thickness, a second interface surface, and a second electrode surface. The second interface surface and second electrode surface are on opposite sides of the second semiconductor layer. The first interface surface and the second interface surface are in electrical, physical, and chemical contact with one another at an interface. The second semiconductor material can transition between a second amorphous state and a second crystalline state at one or more second conditions. A first electrode in physical and electrical contact with the first electrode surface of the first semiconductor layer and a second electrode in physical and electrical contact with the second electrode surface of the second semiconductor layer. The first conditions and second conditions are different. Therefore, in some embodiments, the first and second semiconductor materials can be in different amorphous and/or crystalline states. The layers can have split amorphous/crystalline states. By controlling how the layers are split, the PCD can be in different resistive states.

19 Claims, 12 Drawing Sheets

(52) U.S. Cl.
CPC .......... *H01L 45/14* (2013.01); *H01L 45/1608* (2013.01); *G11C 13/0004* (2013.01); *G11C 13/0069* (2013.01); *G11C 13/0097* (2013.01)

(58) Field of Classification Search
CPC ............ G11C 13/0069; G11C 13/0097; G11C 11/5678; G11C 2013/0092; G11C 2213/50
See application file for complete search history.

(56) References Cited

U.S. PATENT DOCUMENTS

| | | |
|---|---|---|
| 8,383,452 B2 | 2/2013 | Aoyama et al. |
| 8,759,808 B2 | 6/2014 | Nodin et al. |
| 8,828,785 B2 | 9/2014 | Cohen et al. |
| 8,907,316 B2 | 12/2014 | Lung et al. |
| 9,547,819 B1 | 1/2017 | Gotsmann et al. |
| 9,601,692 B1 * | 3/2017 | Jo ...................... G11C 13/0097 |
| 10,312,438 B1 * | 6/2019 | Reznicek ............ H01L 45/1266 |
| 2008/0293224 A1 | 11/2008 | Son et al. |
| 2011/0108792 A1 | 5/2011 | Lam et al. |
| 2011/0155992 A1 | 6/2011 | Kao et al. |
| 2012/0037873 A1 | 2/2012 | Ikarashi et al. |
| 2016/0163898 A1 | 6/2016 | Harada et al. |
| 2016/0268459 A1 | 9/2016 | Kimoto et al. |
| 2021/0249594 A1 * | 8/2021 | Cappelletti ........... H01L 45/144 |

* cited by examiner

PHASE CHANGE DEVICE WITH INTERFACING FIRST AND SECOND SEMICONDUCTOR LAYERS

BACKGROUND

The present invention relates to phase change devices. More specifically, the invention relates to phase change devices with multiple states.

Some phase change devices (PCD) can operate at two states, for example at a high or higher resistive state (HRS) and at a low or lower resistive state (LRS). Other PCDs can operate at multiple states, e.g. at resistance values between the HRS and LRS. Different voltages applied to these devices can set and reset the device states.

In some devices, a dielectric, which is normally insulating, can be made to conduct (in a low resistance state (LRS)) through one or more filaments or conduction paths formed by application of a sufficiently high voltage. Once the filament/path is formed, a voltage change can "reset" the dielectric (e.g. break the filament/path resulting in a HRS) or "set" (re-form the filament/path resulting in a LRS) the dielectric. It is also possible to form/store intermediate states between LRS and HRS by changing the configuration of filaments via electrical bias.

PCDs, like resistive random-access memories (RRAMs), are considered as a promising technology for electronic synapse devices or memristors used in neuromorphic computing as well as for high-density and high-speed non-volatile memory applications. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of RRAMs, which naturally expresses a fully connected neural network.

Making PCDs in the back end of the line (BEOL) can present challenges. While device circuitry is generally placed in lower levels of circuitry in the front end of the line (FEOL) processes, the BEOL typically has multiple dielectric substrate layers that can be difficult to use when fabricating phase change devices, particularly when forming dense arrays of PCDs like large memory structures.

There is a need for structures and methods that enable building PCDs and higher density PCD arrays, particularly in BEOL regions. Further, there is a need for multi-state PCD structures and methods of making these multi-state PCD structures.

SUMMARY

According to some embodiments of the present invention a phase change device (PCD) has a first and second semiconductor layer. The first semiconductor layer made of a first semiconductor material and has a first semiconductor thickness, a first interface surface, and a first electrode surface. The first interface surface and first electrode surface are on opposite sides of the first semiconductor layer. The first semiconductor material can transition between a first amorphous state and a first crystalline state at one or more first conditions. The second semiconductor layer is made of a second semiconductor material and has a second semiconductor thickness, a second interface surface, and a second electrode surface. The second interface surface and second electrode surface are on opposite sides of the second semiconductor layer. The first interface surface and the second interface surface are in electrical, physical, and chemical contact with one another at an interface. The second semiconductor material can transition between a second amorphous state and a second crystalline state at one or more second conditions. A first electrode is in physical and electrical contact with the first electrode surface of the first semiconductor layer and a second electrode is in physical and electrical contact with the second electrode surface of the second semiconductor layer. The first conditions and second conditions are different. Therefore, in some embodiments, the first and second semiconductor materials can be in different amorphous and/or crystalline states.

In some embodiments, the first semiconductor layer is divided or split into a first epitaxial crystalline layer and a first amorphous remainder layer. The first epitaxial crystalline layer has an epitaxial thickness and an epitaxial resistance and the first amorphous remainder layer has a remainder thickness and a remainder resistance. By controlling the epitaxial thickness, the resistance across the first semiconductor, and hence the total resistance across (the electrodes of) the device are controlled to produce multiple resistance states, from a LRS to a plurality of HRSs.

Methods of making and using PCDs are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
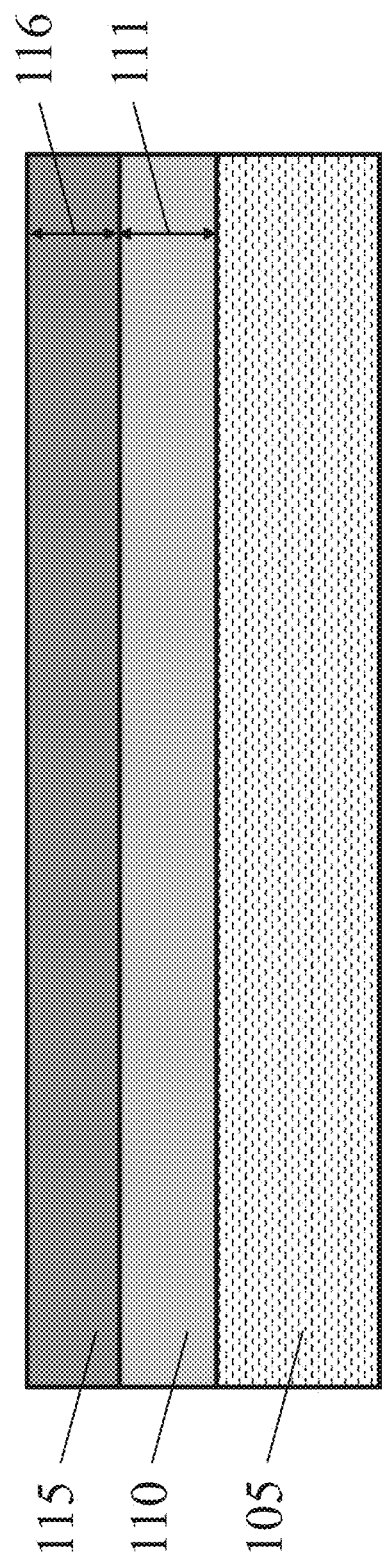
FIG. 1 is a block diagram of an elevation of a preliminary layered structure at an initial step in an example process of making a phase changed device (PCD).

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Embodiments of phase change device (PCD) structures and processes of making and operating PCDs are disclosed.

Non-limiting examples of the PCD structures include a first semiconductor layer and a second semiconductor layers sandwiched between a top and a bottom electrode. The first semiconductor layer and a second semiconductor layer have an interface where each of one of the surfaces (an interface surface) of the first and second semiconductor is in physical contact with the other interface surface. In some embodiments, there is a thin diffusion blocking layer between the first and second interface surface. Each of the first and second semiconductor layers has an electrode surface that is a side of the semiconductor layer opposite the interface surface of the respective semiconductor layer. A first electrode surface on the first semiconductor layer is in physical and electrical contact with the bottom or first electrode and a second electrode surface on the second semiconductor layer is in physical and electrical contact with the top or second electrode.

The materials making the first and second semiconductor layers have different and distinguishable thermal properties in that each of the semiconductors change from an amorphous structure to a crystalline structure under different conditions, e.g. thermal changes like temperature.

A thermal heating and cooling step, e.g. an anneal, is performed to put both the first and second semiconductor layers in a crystalline state.

A "set" step enables an epitaxial crystalline growth or change of the first crystalline layer to form a first epitaxial crystalline layer within the (split) first semiconductor layer, starting at the interface, and penetrating the first semiconductor layer. Accordingly, the first semiconductor layer is divided or split into a first epitaxial crystalline layer and a first amorphous remainder layer. The first epitaxial crystalline layer has an epitaxial thickness and an epitaxial resistance and the first amorphous remainder layer has a remainder thickness and a remainder resistance.

By varying how the set step is perform, e.g. by changing characteristics of a set pulse, the epitaxial thickness and remainder thickness will change. Accordingly, the epitaxial resistance and remainder resistance can be varied and different amounts of resistance (total resistance) across the structure, e.g. different (resistive) states of the structure, can be pre-determined, controlled, and enabled.

Refer now to the Figures.

FIG. 1 is a block diagram of an elevation of a preliminary layered structure 100 at an initial step in an example process of making a phase changed device (PCD).

The structure 100 has a substrate 105. A dielectric layer 110 is disposed upon the substrate 105. In some embodiments, e.g. at the back end of the line (BEOL), the substrate 105 might be eliminated. A bottom electrode 115 is disposed on the dielectric layer 110.

The substrate 105 can be made from a single element (e.g., silicon or germanium); primarily a single element (e.g., with doping), for example silicon; or a compound semiconductor, for example, gallium arsenide (GaAs), or a semiconductor alloy, for example silicon-germanium (SiGe). In some embodiments, the substrate 105 includes one or more semiconductor materials including, but not limited to, silicon (Si), SiGe, Si:C (carbon doped silicon), germanium (Ge), carbon doped silicon-germanium (SiGe:C), Si alloys, Ge alloys, III-V materials (e.g., GaAs, indium gallium arsenide (InGaAs), indium arsenide (InAs), indium phosphide (InP), aluminum arsenide (AlAs), etc.), II-V materials (e.g., cadmium selenide (CdSe), cadmium sulfide (CdS), or any combination thereof) or other like semiconductors. In addition, multiple layers of the semiconductor materials can be used as the semiconductor material of the substrate 105. In some embodiments, the substrate 105 includes both semiconductor materials and dielectric materials. In some silicon on insulator (SOI) implementations, a buried oxide layer, BOX, (e.g., SiO2) is buried in the substrate 105.

In some embodiments, the dielectric layer 110 is made of low-k dielectric. The term "low-k dielectric" generally refers to an insulating material having a dielectric constant less than silicon dioxide, e.g., less than 3.9. As a non-limiting example, the dielectric layer 110 is made of materials including: dielectric oxides (e.g. silicon oxide, $SiO_x$); dielectric nitrides (e.g., silicon nitride, SiN; siliconborocarbonitride, SiBCN; siliconcarbonitride, SiCN; and siliconboronitride SiBN); dielectric oxynitrides (e.g., silicon oxycarbonitride, SiOCN, and silicon oxynitride, SiON); silicon carbide (SiC); silicon oxycarbide (SiCO); or any combination thereof or the like.

The dielectric layer 110 can be deposited by known deposition techniques including: atomic layer deposition (ALD), chemical vapor deposition (CVD), Plasma Enhanced Chemical Vapor Deposition (PECVD), Radio Frequency Chemical Vapor Deposition (RFCVD,) Physical Vapor Deposition (PVD), Pulsed Laser Deposition (PLD), and/or Liquid Source Misted Chemical Deposition (LSMCD).

In some embodiments, the dielectric layer 110 has a dielectric layer thickness 111 between 50 nanometers (nm) and 100 nm. Other thicknesses 111 are envisioned.

The first or bottom electrode 115 is made of a conductive material, e.g. a metal. Non-limiting examples of metals include: copper (Cu), tungsten (W), aluminum (Al), nickel (Ni), thallium nitride (Tl3N), and titanium nitride (TiN). In some embodiments, the first/bottom electrode 115 is made of Al.

The first/bottom electrode 115 can be deposited by ALD, CVD, PECVD, RFCVD, PVD, PLD, LSMCD, and/or sputtering.

In some embodiments, the first electrode 115 thickness 116 is between 50 nanometers (nm) and 100 nm. Other thicknesses 116 are envisioned.

Figure 2:
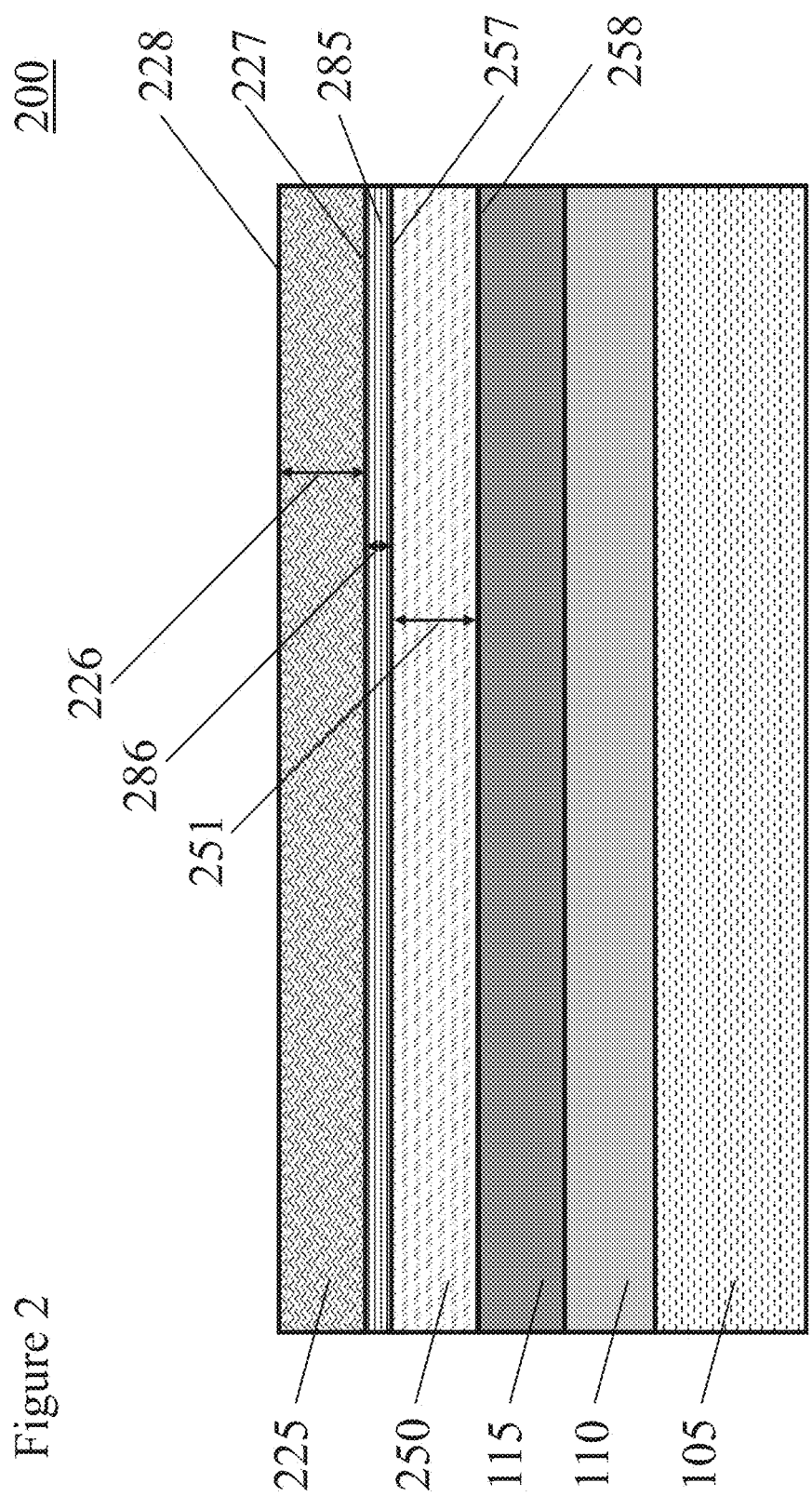
FIG. 2 is a block diagram of an elevation of a preliminary layered structure after the addition of two semiconductor layers and an optional diffusion blocking layer.

FIG. 2 is a block diagram of an elevation of a preliminary layered structure 200 after the addition of two semiconductor layers (250, 225) and an optional diffusion blocking layer 285.

A first semiconductor layer 250 is made of a first semiconductor material capable of being in an amorphous form (first amorphous form) and a crystalline form (first crystalline form). A second semiconductor layer 225 is made of a second semiconductor material capable of being in an amorphous form (second amorphous form) and a crystalline form (second crystalline form). The amorphous forms can transition to crystalline forms (and visa versa) under various physical conditions. The first semiconductor material has properties that cause the first semiconductor material to transition from amorphous form to crystalline form under conditions (e.g. application of temperature and/or voltage) that are different than the conditions under which the second semiconductor makes these transitions.

In some embodiments, the first semiconductor layer 250 material is germanium (Ge) and the second semiconductor layer 225 material is silicon (Si). Other materials are envisioned.

The first semiconductor layer 250 has a first semiconductor layer 250 thickness 251 between 20 nm and 50 nm. The second semiconductor layer 225 has a second semiconductor layer 225 thickness 226 between 20 nm and 50 nm, as well.

The first semiconductor layer 250 has a first interface surface 257 and a first electrode surface 258. The first interface surface 257 and the first electrode surface 258 are opposite one another, i.e. on opposite sides of the first semiconductor layer 250.

The second semiconductor layer 225 has a second interface surface 227 and a second electrode surface 228. The second interface surface 227 and the second electrode surface 228 are opposite one another, i.e. on opposite sides of the first semiconductor layer 225.

The first electrode surface is in physical and electrical contact with the first/bottom electrode 115. In some embodiments, the first interface surface 257 is in physical, chemical, and electrical contact with the second interface surface 227. In alternative embodiments, there is an optional diffusion blocking layer (DBL) 285 "sandwiched" between the first 257 and second 227 interface surfaces. The second electrode surface 228 is in physical and electrical contact with the second/top electrode 515, shown below, e.g. in FIG. 5.

The DBL 285 prevents diffusion of the first semiconductor layer 250 material (e.g. Ge) into the second semiconductor layer 225 material, (e.g. Si). The DBL can be made of Titanium Nitride (TiN) or carbon (C). Other known barrier or diffusion prevention materials can be used.

The DBL 285 is a thin layer having a thickness 286 between 1 nm and 10 nm.

The first 250 and second 225 semiconductor layers and the DBL 285 can be deposited by ALD, CVD, PECVD, RFCVD, PVD, PLD, and/or LSMCD. The order of deposition is inconsequential. However, if the optional DBL layer 285 is disposed, the DBL layer 285 will be between the first 257 and second 227 interface surfaces. If the order of depositing the semiconductor layers (250, 225) is reversed, the second electrode surface 228 is in physical and electrical contact with the first/bottom electrode 115 and the first electrode surface 258 is in physical and electrical contact with the second/top electrode 515. However, in either case, the first semiconductor layer 250 will be the semiconductor layer with the epitaxial growth, as described below, without loss of generality.

Figure 3:
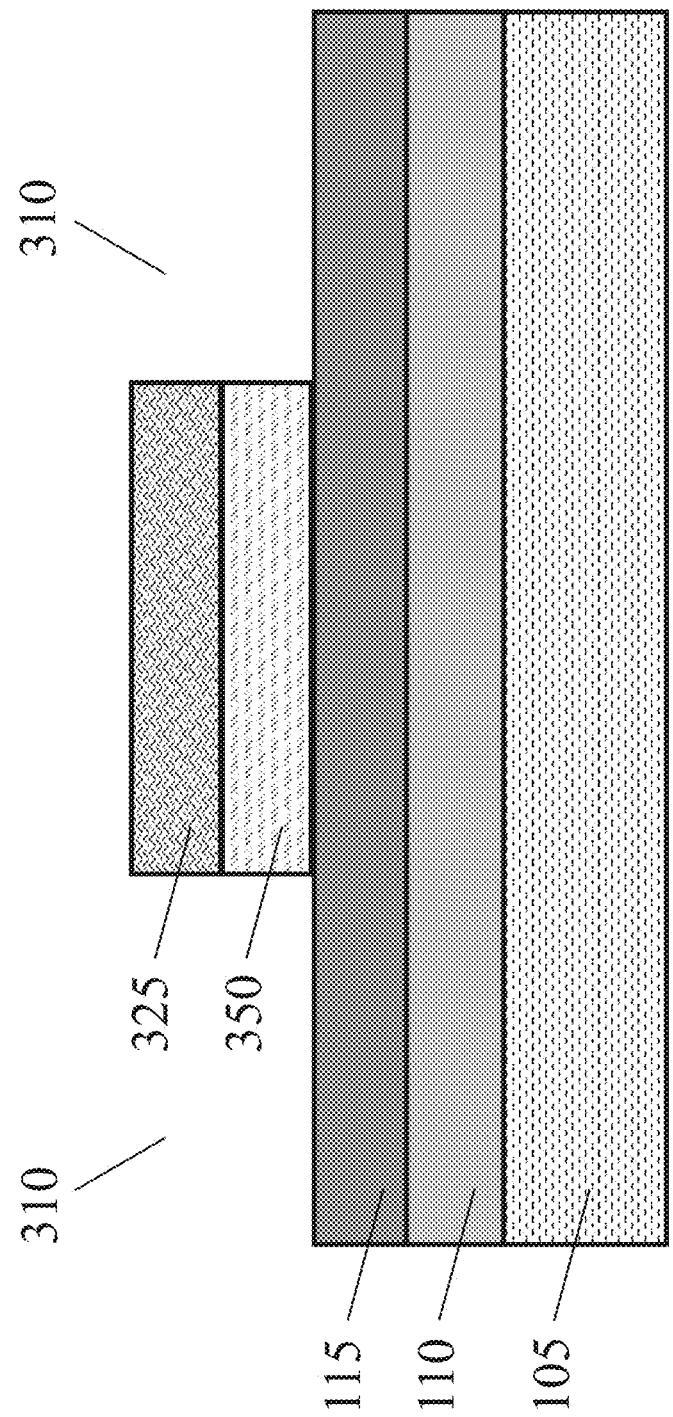
FIG. 3 is a block diagram of an elevation of a preliminary layered structure after a mask etching step that defines the PCD footprint.

FIG. 3 is a block diagram of an elevation of a preliminary layered structure 300 after a known mask etching step, e.g. a directional reactive ion etch (RIE), that defines the PCD footprint. A mask protects parts of the semiconductor layers (225, 250) while volumes of the semiconductor layers (225, 250) are removed 310 around (left and right—and front and back, not shown) the remaining semiconductor layers (350, 325). One or more known chemistries suitable to remove the unmasked first 250 and second 225 semiconductor layer 250 can be used. In some embodiments, the etching will stop at a barrier layer, e.g. the first/bottom electrode 115.

In this structure 300 and following structures, the DBL 285 may or may not be included in the structure but the DBL 285 is not shown for reasons of clarity. This masked etching defines the size and/or area the PCD uses on the surface of the first/bottom electrode 115 surface, i.e. the PCD footprint.

Figure 4:
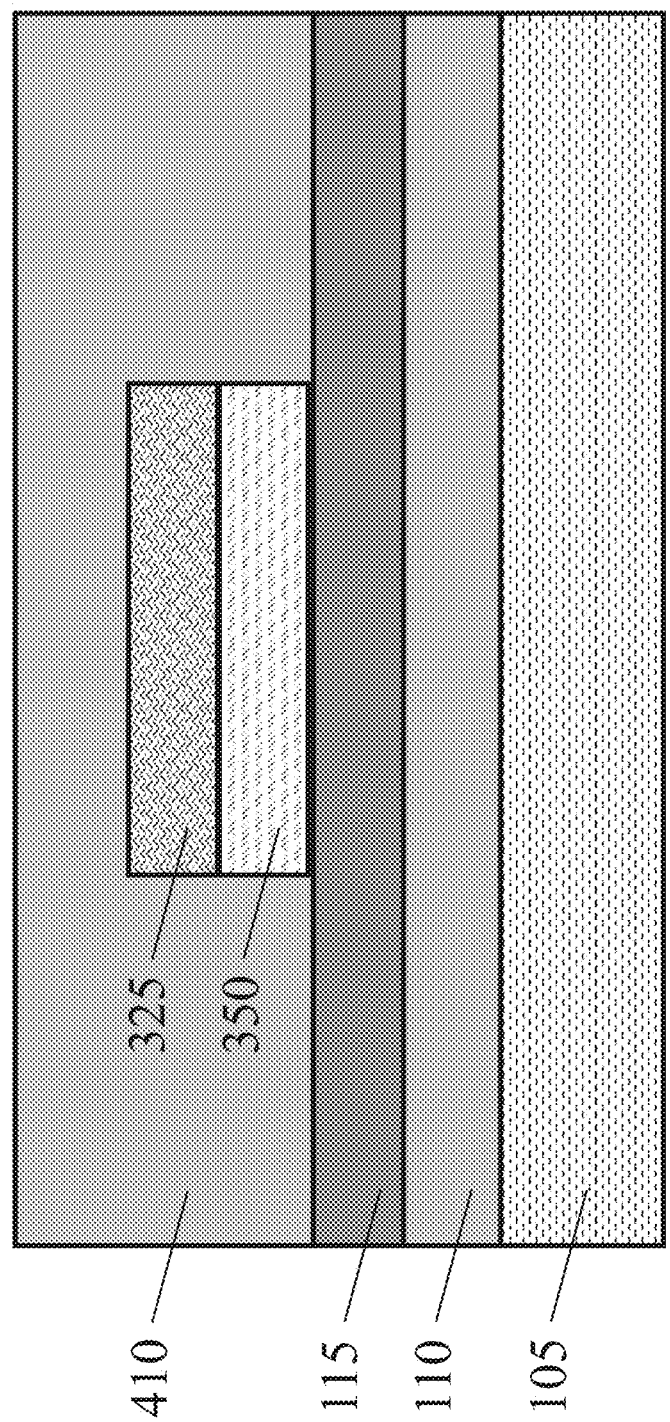
FIG. 4 is a block diagram of an elevation of a preliminary layered structure covered with a dielectric.

FIG. 4 is a block diagram of an elevation of a preliminary layered structure 400 covered with a dielectric 410.

In some embodiments, the dielectric 410 can be the same type as in the dielectric layer 110 and/or disposed by the same methods. In some embodiments, the dielectric 410 can be an interlayer dielectric (ILD). The ILD 410 may be formed from, for example, a low-k dielectric material (with k<4.0), including but not limited to, silicon oxide, spin-on-glass, a flowable oxide, a high-density plasma oxide, borophosphosilicate glass (BPSG), or any combination thereof. The ILD 410 is deposited by a deposition process, including, but not limited to CVD, PVD, PECVD, ALD, evaporation, chemical solution deposition, or like processes.

Figure 5:
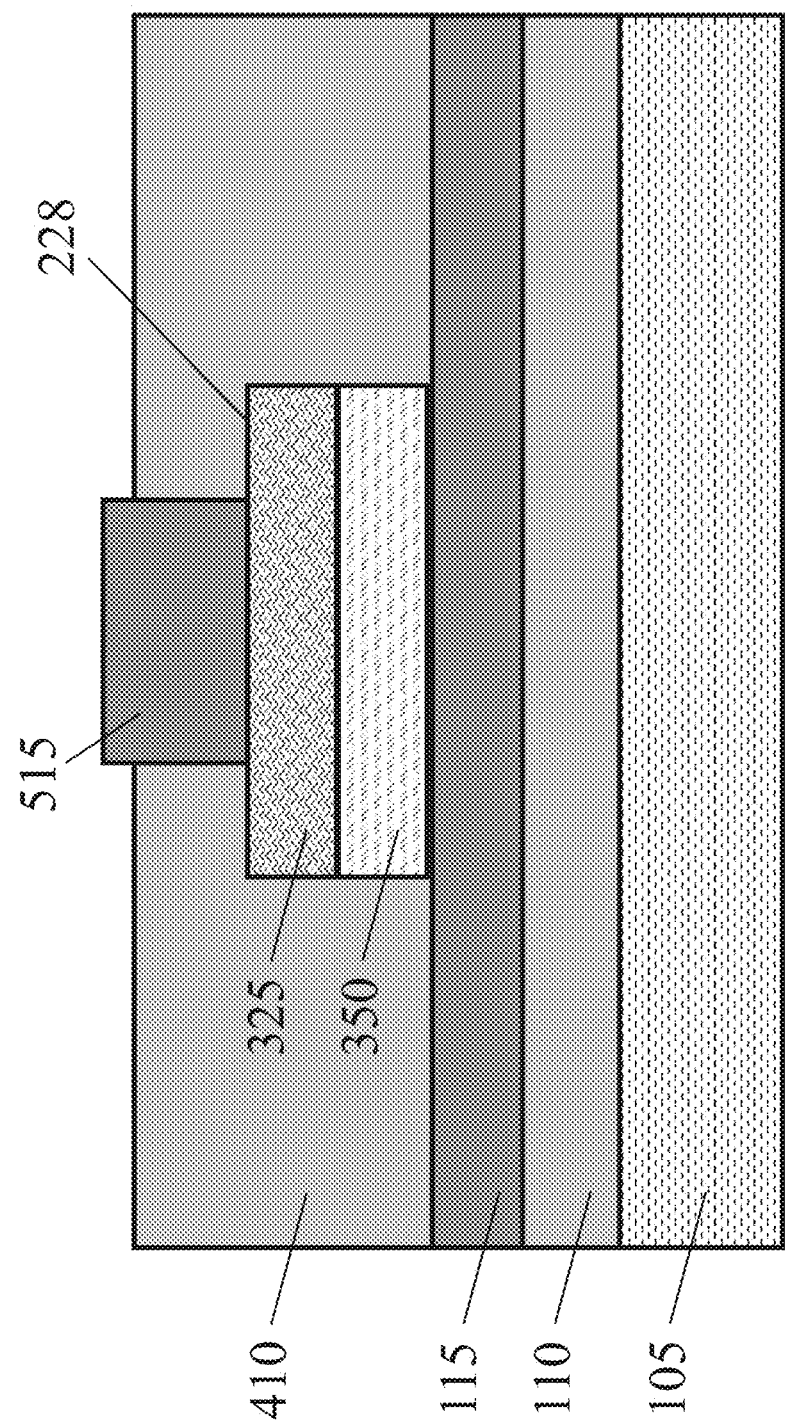
FIG. 5 is a block diagram of an elevation of a layered structure including a top electrode that is precursor of a PCD.

FIG. 5 is a block diagram of an elevation of a layered structure 500 including a second/top electrode 515. The structure 500 is precursor of a PCD in that the structure 500 is complete but the semiconductor layers (325, 350) need to have their chemical structure transformed to operate efficiently as a PCD, as described below.

The second/top electrode 515 is formed by performing a masked etch, e.g. a directional RIE, through the ILD/dielectric layer 410 above the second semiconductor layer 325. In some embodiments, the etch stops at the second electrode surface 228. Using materials and methods like those used to deposit the first electrode layer 115, the second/top electrode 515 is deposited to be in physical and electrical contact with the second electrode surface 228.

Figure 6:
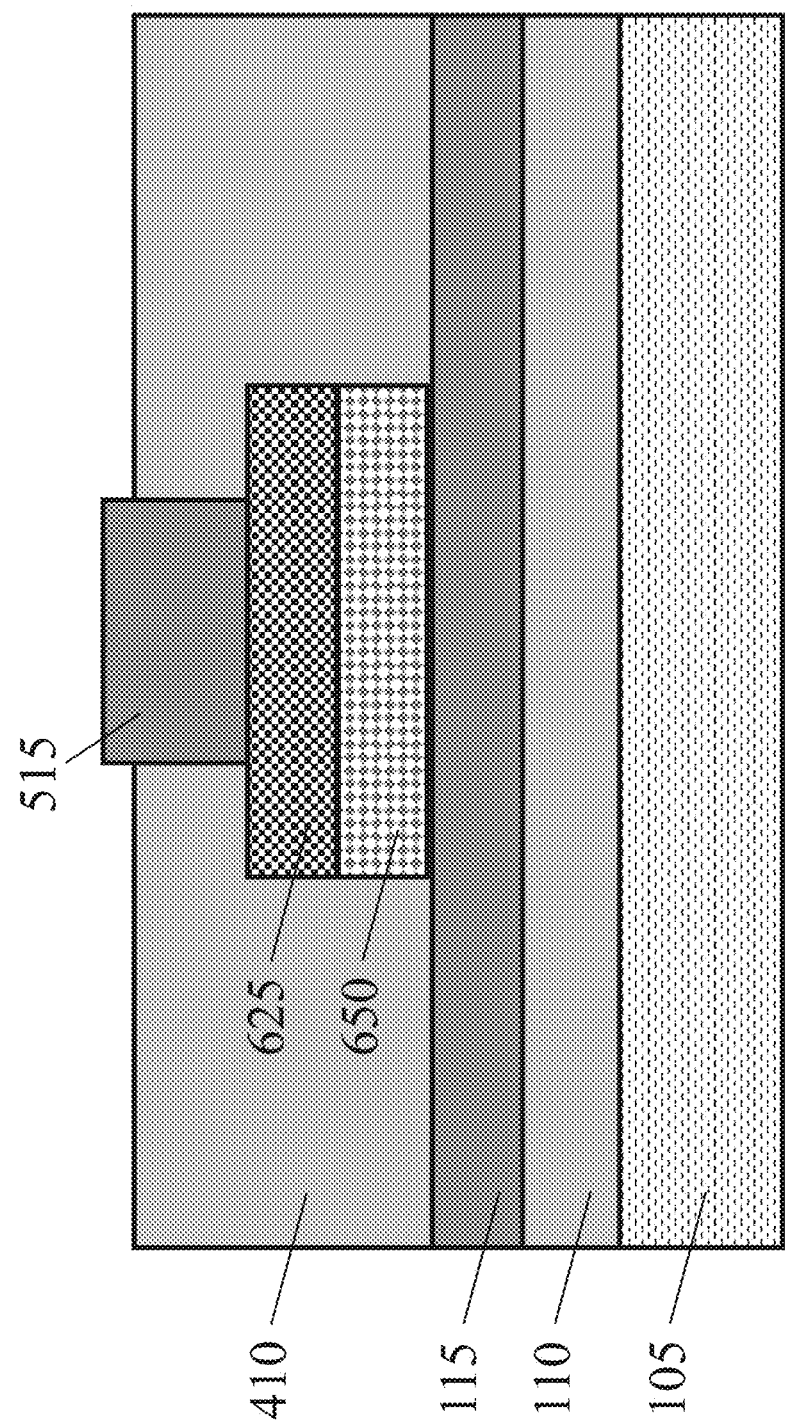
FIG. 6 is a block diagram of an elevation of a precursor PCD embodiment after a first and second semiconductor layer are heated and cooled to form a crystalline structure.

FIG. 6 is a block diagram of an elevation of a precursor PCD embodiment 600 after a first 350 and second semiconductor layer 325 are heated and cooled to form crystalline structures (650, 625).

A physical process is performed so that both the first 350 and second 325 semiconductor layers experience one or more changed physical conditions that transform the first semiconductor structure 350 into a first crystalline state 650 and transform the second semiconductor structure 325 into a second crystalline state 625.

In some embodiments, the changed physical condition is a thermal anneal. In other words, both the semiconductor layers (350, 325) are heated above a temperature at which they melt and then cooled over time so both the first 650 and second 625 crystalline semiconductor layers are formed. The time and temperature levels that crystallize both the first 650 and second 625 layers crystalline depend on the type of the material in the layer and the volume of material within the layer. While actual time and temperature values need to be determined for the specific situation, as a non-limiting example, the temperature is raised to a temperature between 900 degrees Celsius (C) and 1000 C locally within the device and allowed to cool to room temperature over a period between 1 micro second and 10 micro second seconds.

In a non-limiting example, amorphous Ge (α-Ge) in the first semiconductor layer 350 is changed to crystalline Ge (c-Ge) 650 and the amorphous Si (α-Si) in the second semiconductor layer 325 is changed to crystalline Si (c-Si) 625 by the anneal step.

Figure 7:
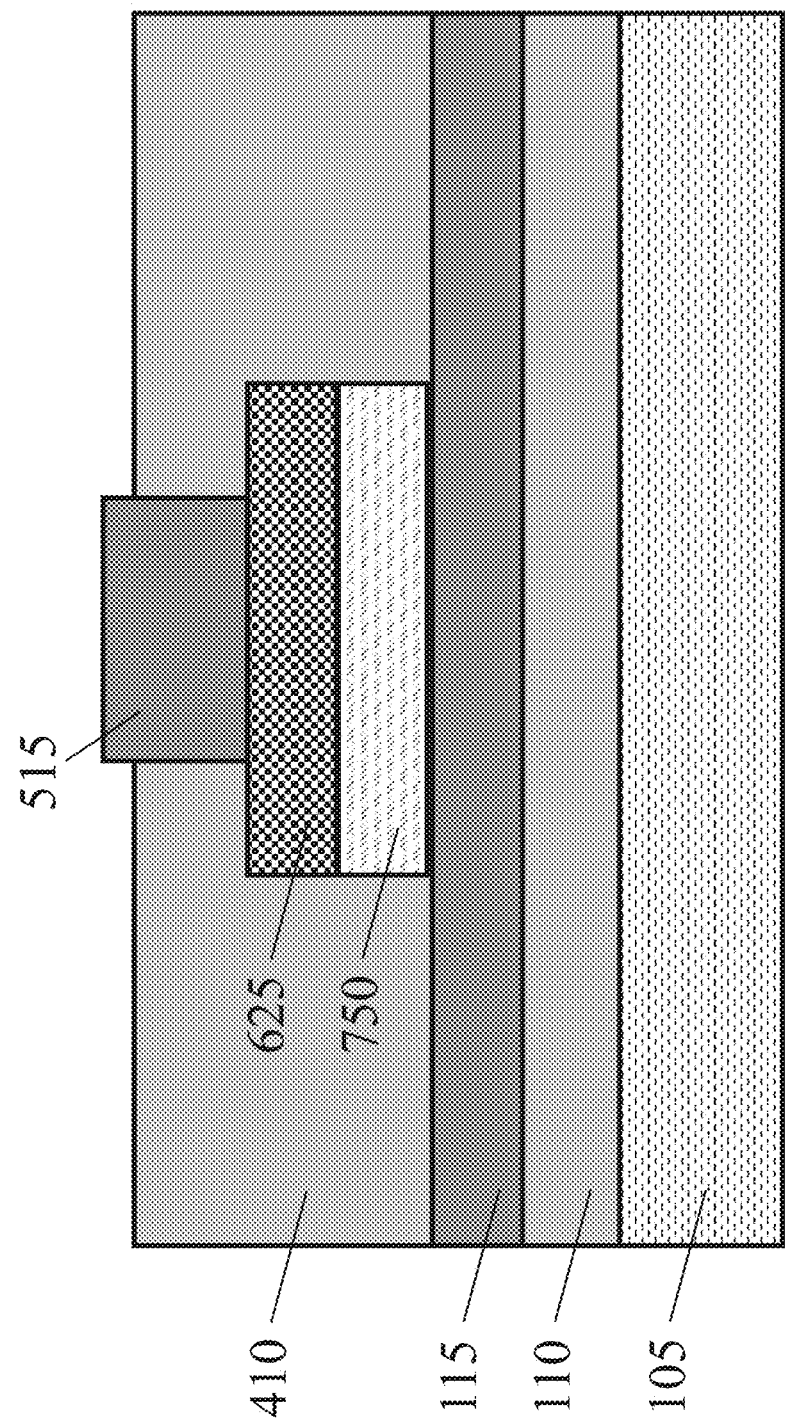
FIG. 7 is a block diagram of an elevation of a PCD embodiment after the first semiconductor layer is reset to an amorphous structure.

FIG. 7 is a block diagram of an elevation of a PCD embodiment 700 after the first crystalline semiconductor layer 650 is reset to an amorphous structure 750.

The first crystalline structure semiconductor layer 650 is "reset" to the amorphous structure 750 without changing the structure of the second crystalline structure semiconductor layer 625. This is due to the fact that the first (350, 650) and second (325, 625) semiconductor layers each have properties that made their transitions from amorphous to crystalline (and back again) at one or more different and distinguishable physical conditions. Therefore, the transition from amorphous to crystalline (and back again) can be made in the first (350, 650) semiconductor layer structure without effecting the second (325, 625) semiconductor layer structure.

In a non-limiting example, Ge makes the transition from amorphous to crystalline (and back again) at a lower temperature than Si. By applying one or more electrical/voltage pulses across the first/bottom 115 and second/top 515 electrodes, current flows through the first (350, 650) and second (325, 625) semiconductor layers causing them to heat up. The pulses are designed to heat the Ge above the Ge transition point (temperature) but below the Si transition point. Accordingly, the first crystalline semiconductor layer 650 (e.g. c-Ge) melts but the second crystalline semiconductor layer 625 does not melt. There is a quick cooling period that is too fast to re-form the first amorphous semiconductor layer 750 into a crystalline state. The second crystalline 625 semiconductor layer 625 (e.g. c-Si) does not change from the crystalline state 625, due to the temperature/voltage change.

The structure 700 is now "reset" having the first semiconductor layer 350 in an amorphous state 750 at a higher resistance. Accordingly, the entire resistance of the structure 700 is higher because of the increased resistance of the first amorphous semiconductor layer 750. The structure 700 is reset in a HRS due to the amorphous structure of the first semiconductor layer 350. "Setting", described below, the first semiconductor layer 350 back to the crystalline structure decreases the resistance across the first semiconductor layer (350, 650) and puts the structure 700 in multiple HRS until reaching a LRS—a PCD with two or more states, a LRS and a multiple HRS.

Material type in the first 350 and second 325 semiconductor layers, the volumes of the layers, and other factors are used to design the timing, shape, and magnitude of the voltage pulses. Examples of pulse timing, shape, and magnitude of the voltage pulses used to "reset" are given below in FIG. 10A. In some embodiments, in the reset state, the entire volume of the first semiconductor layer 350 is in the amorphous state.

Figure 8:
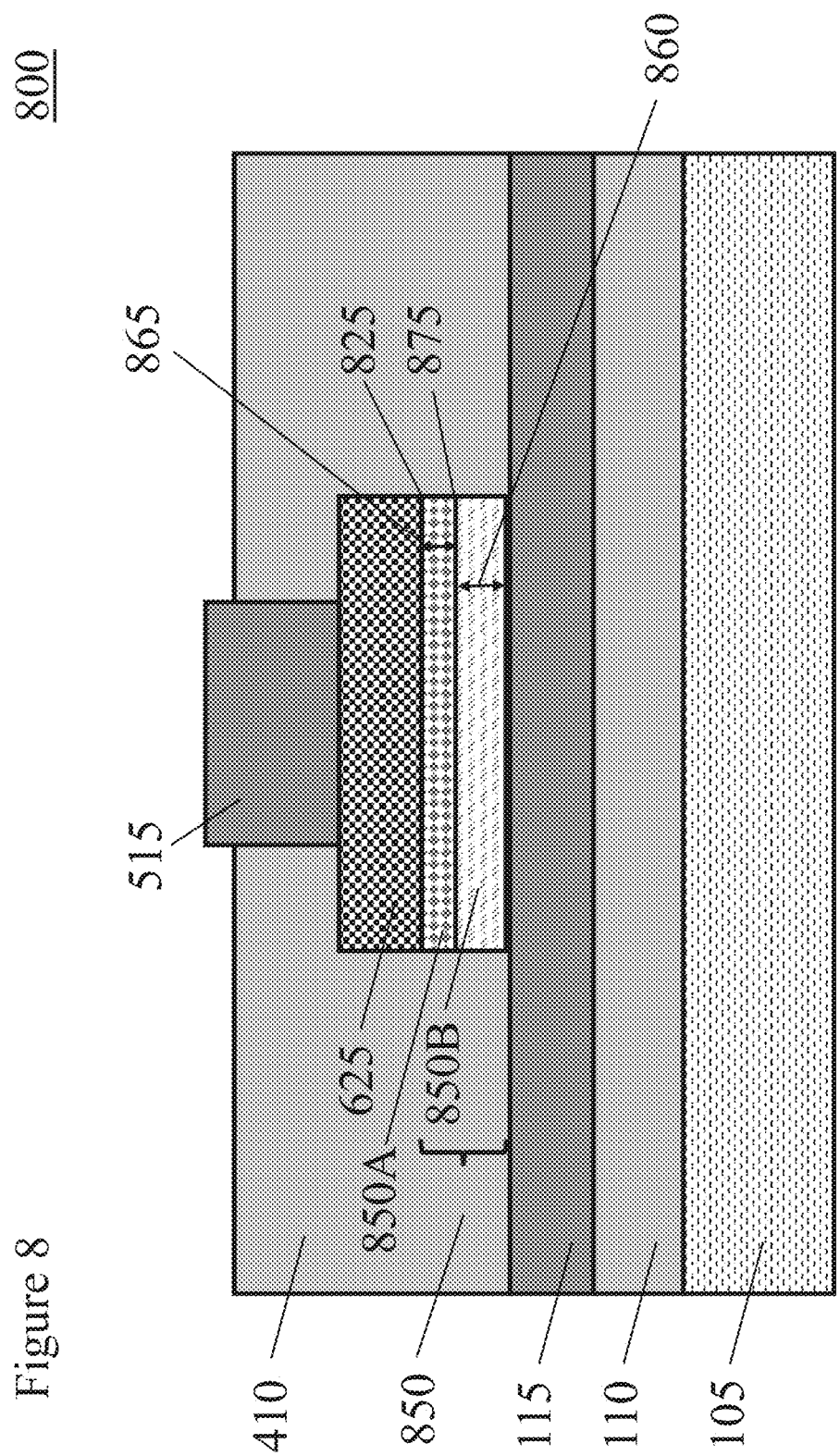
FIG. 8 is a block diagram of an elevation of a PCD embodiment after the first semiconductor layer is set to one of a plurality of two-layer structures, a first semiconductor crystalline layer and a first semiconductor amorphous layer.

FIG. 8 is a block diagram of an elevation of a PCD embodiment 800 after the first amorphous semiconductor layer 850 is "set" to one of a plurality of two-layer structures (850A, 850B), a first semiconductor crystalline layer 850A and a first semiconductor amorphous layer 850B.

In one embodiment, a set pulse (see FIG. 10B) causes the first amorphous semiconductor layer (e.g. after a reset pulse resets the first semiconductor layer totally in the amorphous state 750) to change into a split first semiconductor layer 850, split into two layers: 1. a first epitaxial crystalline layer 850A that has an epitaxial thickness 865 and an epitaxial resistance and 2. a first amorphous remainder layer 850B that has a remainder thickness 860 and a remainder resistance. The remainder layer 850B is what remains of the amorphous layer 750 of the first semiconductor amorphous layer 750 after a set pulse.

The shape, durations, timing, and magnitudes of the set pulse determine how large, e.g. the thickness 865 of the first epitaxial crystalline layer 850A and the thickness 860 of the first amorphous remainder layer 850B. Accordingly, the epitaxial resistance and remainder resistance can be controlled by the design of the set pulse which controls the thicknesses (825, 860) of the respective epitaxial crystalline layer 850A and remainder layer 850B. Therefore, the resistance of the split first semiconductor layer 850 and the total resistance of the entire device 800 (measured across the first and second electrodes 115/515) in the set state, i.e. the amount of resistance in the HRSs, is controlled by the design of the set pulse.

Other factors that affect the amount of resistance of the device 800 in one of the multiple HRS and how the set pulse is designed include the first 250 and second 225 semiconductor layer materials and thicknesses (251, 226) and the type of material and thickness 286 of the DBL layer 285, if any.

As a result, with other external physical conditions of the first 250 and second 225 semiconductor layer held constant, multiple high resistance states, e.g. values of total resistance of the device 800 in the set state can be created by varying the shape, durations, timing, and magnitudes of the set pulse. Therefore, structure 800 can be a PCD with multiple (resistive) set states by varying the set pulse.

By varying how the set step is performed, e.g. by changing characteristics of a set pulse, the epitaxial thickness and remainder thickness will change. Accordingly, the epitaxial resistance and remainder resistance can be varied and different amounts of resistance across the structure, e.g. different states of the structure, can be pre-determined, controlled, and enabled.

The design of the set pulse determines how the first epitaxial crystalline layer 850A is formed.

The term "epitaxially growth" means the growth of a semiconductor material on a contact surface of a semiconductor material, in which the semiconductor material being grown has the same crystalline characteristics as the semiconductor material of the deposition surface. Material parameters can be created so that the atoms at the surface 875 of the growing layer 850A have sufficient energy to move around on the surface 875 and orient themselves to the crystal arrangement of the atoms at where the epitaxial growth is continuing.

For example, if the set pulse is designed to heat and melt the first amorphous semiconductor layer 750, the atoms in the first amorphous semiconductor layer 750 will have enough energy to move around. If in addition, the set pulse allows the first amorphous semiconductor layer 750 to cool slowly, the moving atoms (e.g. of Ge) will move into the crystal orientation of a crystal surface in which they are in contact.

Where there is a DBL 985, the DBL 985 can act as a template for the Ge crystallization.

To continue with this non-limiting example, when the set pulse melts the first amorphous semiconductor layer 750 material (Ge), the material (Si) in the second semiconductor layer 625 remains in a crystalline structure. As the atoms in the first amorphous semiconductor layer 750 slowly cool, they arrange themselves in the crystalline order of the second semiconductor layer 625 starting at the interface 825. As the layer 850 continues to slowly cool, more of the atoms in the first amorphous semiconductor layer 750 arrange in the crystalline order thus growing the thickness 865 of the growing first epitaxial crystalline layer 850A and moving the boundary surface 875 deeper into the first amorphous semiconductor layer 750. As the thickness 865 of the first epitaxial crystalline layer 850A increases, the thickness 860 of the remainder layer 850B decreases.

By changing the thickness 865 of the first epitaxial crystalline layer 850A and the thickness 860 of the remainder layer 850B, the resistances of these layers change and therefore, the entire resistance of the device 800 changes by controlling the set pulse.

In some embodiments, by causing the set pulse(s) to slowly decrease in value over time, e.g. by reducing the rate of change of cooling and/or increasing the cooling time of the split first semiconductor layer 850, the thickness 865 of the first epitaxial crystalline layer 850A will increase and the thickness 860 of the remainder layer 850B will decrease.

Figure 9:
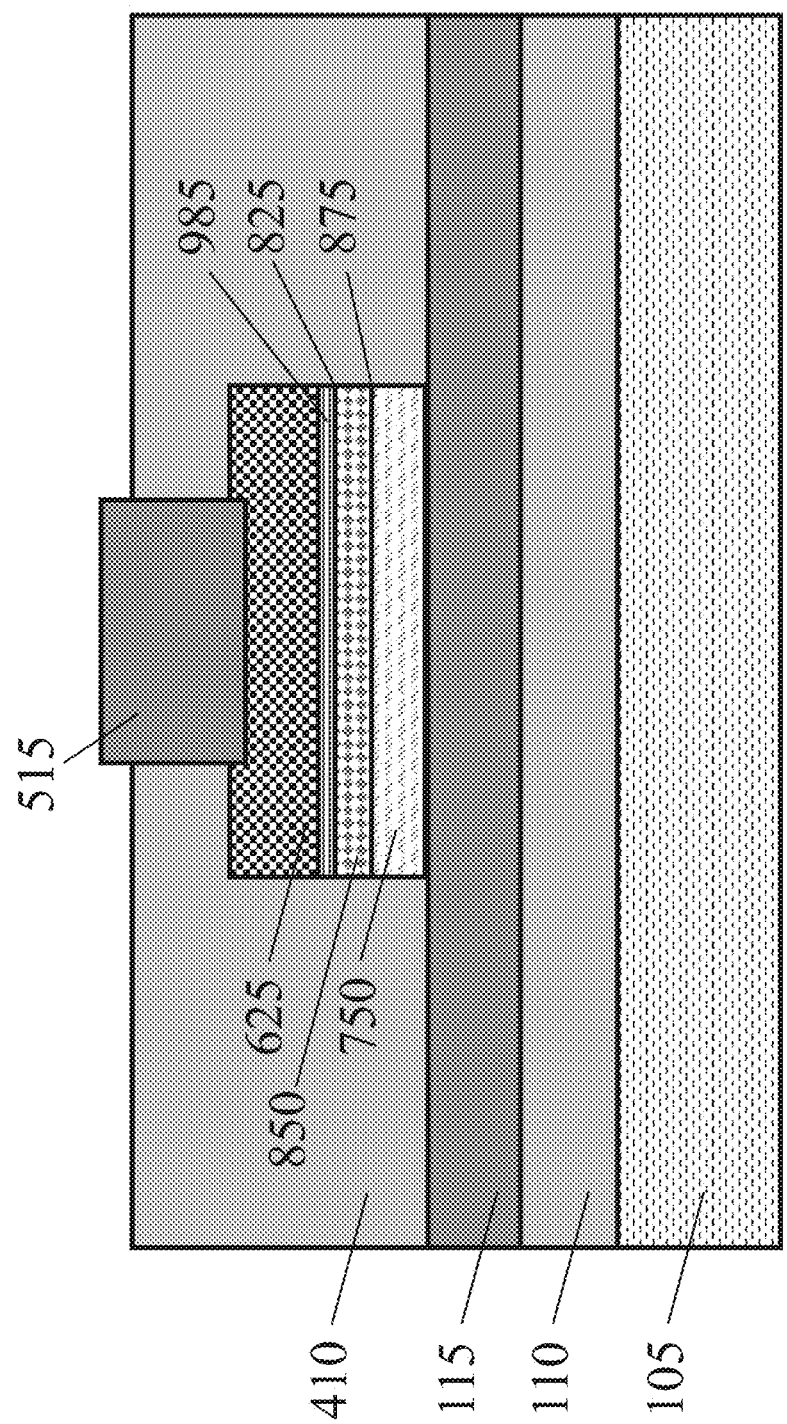
FIG. 9 is a block diagram of an elevation of an alternative PCD embodiment with a diffusion blocking layer.

FIG. 9 is a block diagram of an elevation of an alternative PCD embodiment 900 with a diffusion blocking layer (DBL) 985. The blocking layer 985 is formed by depositing the optional layer 285 shown in FIG. 2 and continuing with process steps performed in the case when no DBL 285 was deposited.

Figure 10A:
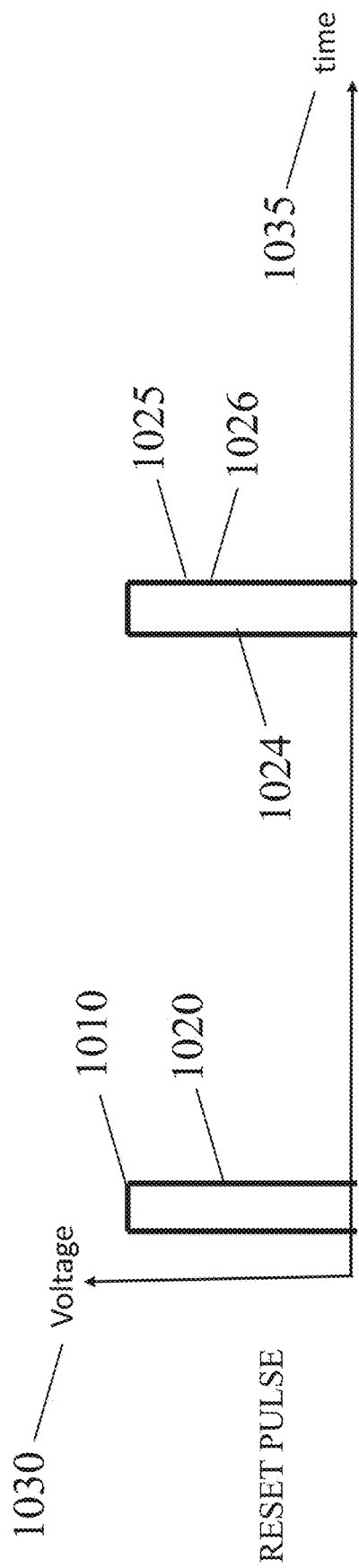
FIG. 10A is a voltage vs time plot showing one or more reset pulses.

FIG. 10A is a voltage 1030 vs time 1035 plot 1000 showing one or more reset pulses, typically 1025. The reset pulses 1025 have a duration 1010 and magnitude 1020 high enough to melt the material in the first semiconductor layer 250 (e.g. Ge) but not in the second semiconductor layer 225 (e.g. Si). However, the duration 1010 is short enough and, in particular, the fall time 1026 is fast enough so that the first 250 semiconductor layer material has no time to crystallize. Therefore, the first 250 semiconductor layer material remains in/returns to an amorphous structure/state 750 when the device 800/900 is reset.

Figure 10B:
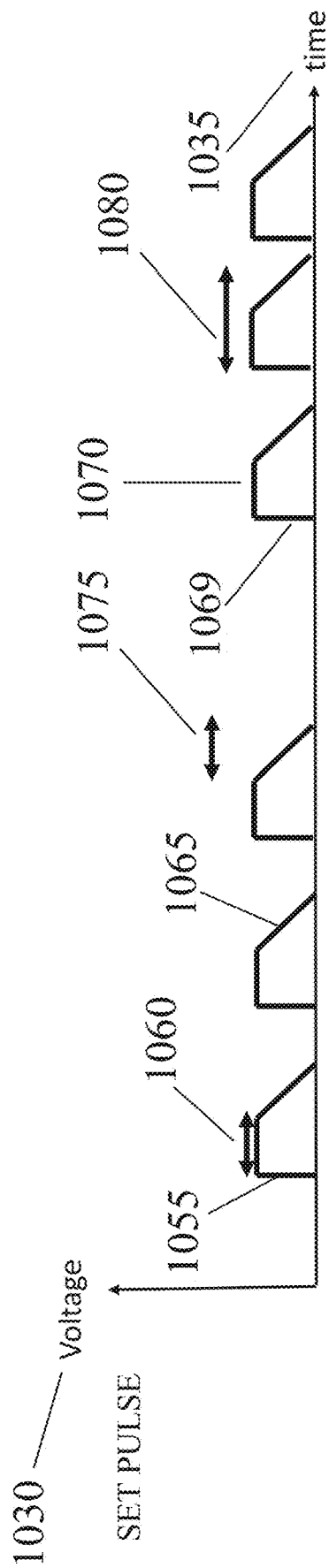
FIG. 10B is a voltage vs time plot showing one or more set pulses.

FIG. 10B is a voltage 1030 vs time 1035 plot 1050 showing one or more set pulses, typically 1070. The set pulses have a magnitude 1055 and a duration 1060 with a gradual fall time rate 1065 over a set pulse fall time 1075. For example, the fall time rate 1065 is the magnitude 1055 of the pulse 1070 divided by the set pulse fall time 1075.

As discussed, the design of magnitudes (1020, 1055), timing (1010, 1060, 1075), duration (1010, 1080), and shape of these pulses (1025, 1070) among other things depends on the types of material in and the thickness (251, 226) of the first 350 and second 325 semiconductor layers.

However, in some embodiments, the reset pulse 1025 has a reset pulse magnitude 1020 of between 7 and 10 volts, e.g. 8 volts; a reset pulse rise time 1024 between 2.0 and 3.0 nanoseconds (ns), e.g. 2.5 ns; and a reset pulse fall time 1026 between 2.0 and 3.0 nanoseconds (ns), e.g. 2.5 ns. The reset pulse shape can be rectangular or other shapes. However, the reset pulse fall time 1026 must be fast enough so the material does not crystallize. The reset pulse 1025 magnitude 1020 has to be low enough so crystalline structure of the material of the second semiconductor layer 625 does not change.

In some embodiments, non-limiting examples, the set pulse 1070 has a magnitude 1069 of between 4 and 6 volts, e.g. 5 volts; a set pulse rise time 1069 between 2.0 and 3.0 nanoseconds (ns), e.g. 2.5 ns; and a longer set pulse fall time 1075 between 0.8 milliseconds (ms) and 1.5 ms, e.g. 1.0 ms. Some set pulse shapes have gradual falling fall times e.g. more than 1.0 ms to give the first semiconductor crystalline layer 850A crystalline structure time to form. The duration 1080 of the set pulse 1070 is long enough to include the long fall time 1075, e.g. 1.0 ms or more.

Figure 11:
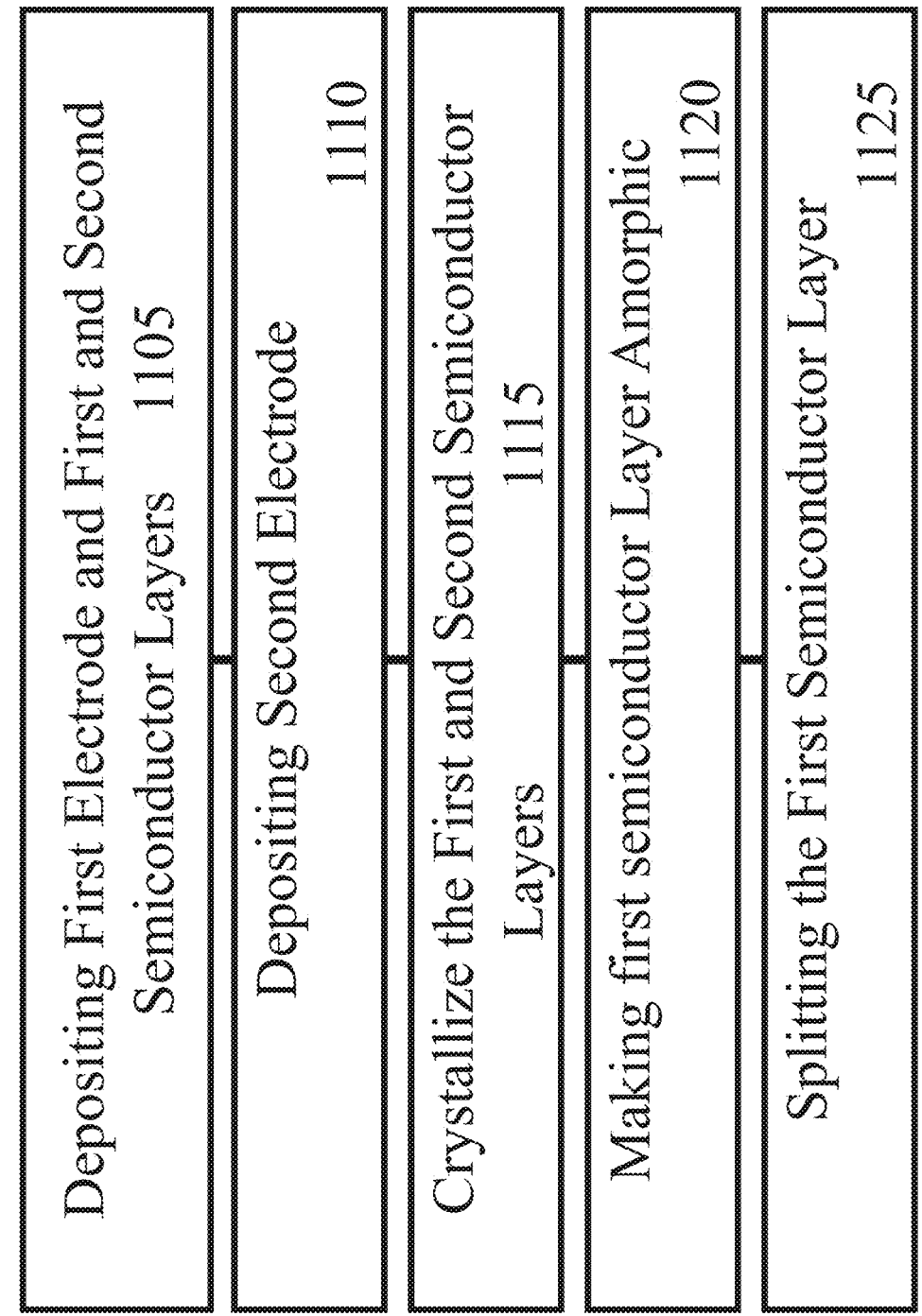
FIG. 11 is a flow chart of an embodiment of a process of making a PCD.

FIG. 11 is a flow chart of an embodiment of a process of making 1100 a PCD.

Step 1105 of the method begins with deposition the first electrode 115 on the dielectric layer 110 and/or substrate 105. Then the first 250 and second 225 semiconductor layers are deposited. In some embodiments the diffusion blocking layer 285 is deposited between the electric first 250 and second 225 semiconductor layers.

Step 1110 deposits the second electrode 515 after doing the etching defining the PCD footprint and other lithographic steps as defined in FIGS. 3 to 5.

Step 1115 crystallizes the first 250 and second 225 semiconductor layers with thermal heating and cooling step, e.g. an anneal, as described in FIG. 6. Other crystallization methods are possible.

Step 1120 makes the first semiconductor layer amorphous by changing a physical condition, e.g. with a reset voltage pulse 1025, placing the device in the reset state or LRS.

Step 1125 splits the first semiconductor layer 850 into first semiconductor crystalline layer 850A and a first semiconductor amorphous layer 850B by changing a physical condition, e.g. with set voltage pulse 1075. This places the device 800 in one of a plurality of resistive states (as measured by the total resistance across the first 115 and second 515 electrodes) as selected by the design of the set voltage pulse 1075. The resistive states will have a total resistance across the device 800 with one of a plurality of values between the LRS and a HRS. In the LRS the first semiconductor crystalline layer 850A has a width or epitaxial thickness 865 that is equal to the total first semiconductor layer 250 width 251.

Figure 12:
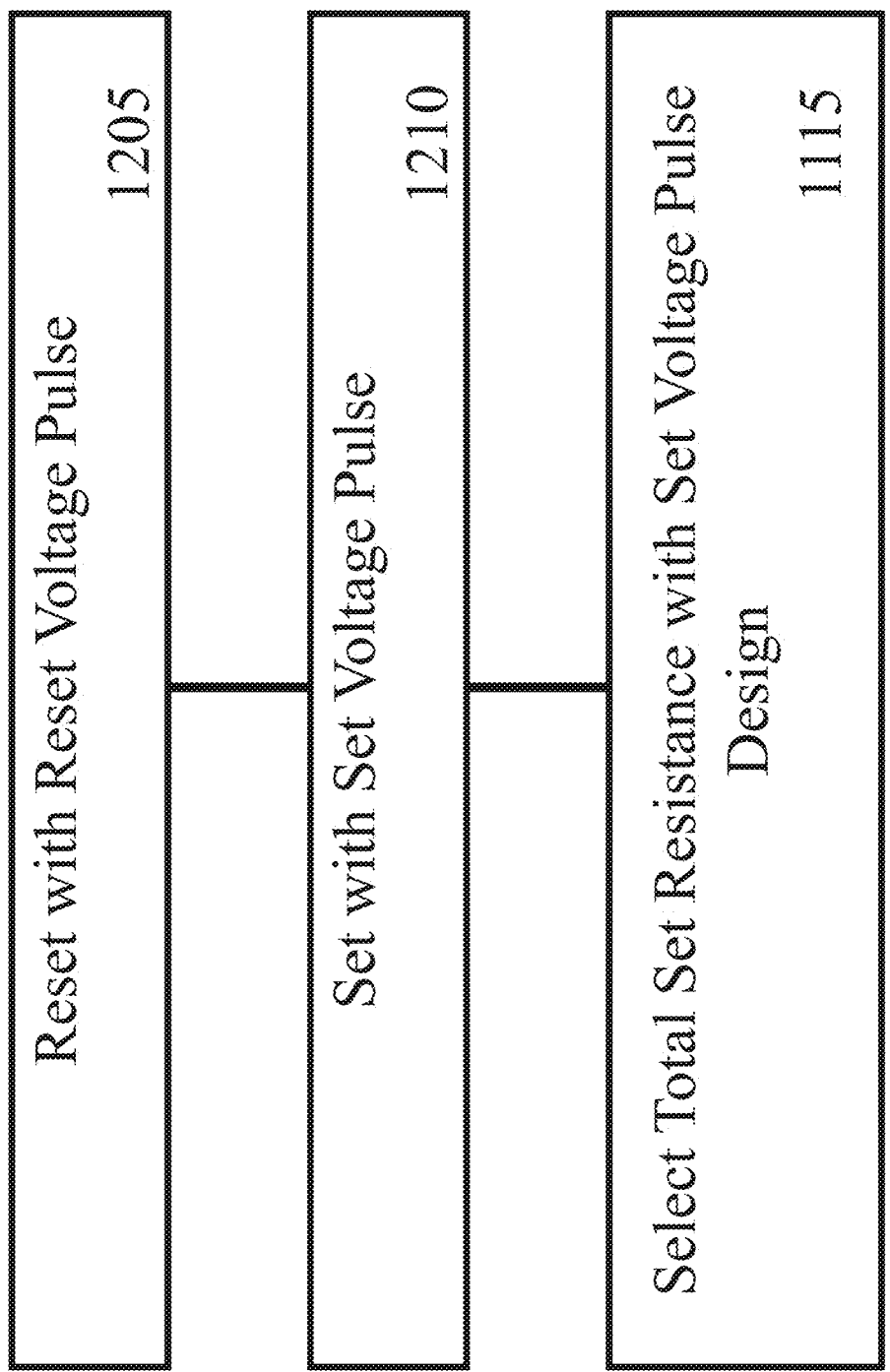
FIG. 12 is a flow chart of an embodiment of a process for operating a PCD.

FIG. 12 is a flow chart of an embodiment of a process for operating 1200 a PCD.

The process 1200 starts with step 1205 that resets the first semiconductor layer 850 to an amorphic state where the all the first semiconductor 850 material is in the amorphic state 750. In some embodiments, this step is performed with a reset pulse 1025.

In step 1210 the device, e.g. 800, is set to split the first semiconductor layer 850 into the first semiconductor crystalline layer 850A and the remainder layer 850B.

In step 1215, the total resistance across the device, e.g. 800, selected by the set pulse as described in FIG. 10B. The total resistance is the resistance measured across the first 115 and second 515 electrodes. The total resistance is greatly influenced by the resistance of the first semiconductor layer 850 which in turn is influenced by the width or epitaxial thickness 865 of the first semiconductor crystalline layer 850A. The greater the epitaxial thickness 865, the greater the volume of the first semiconductor layer 850 material is in the crystalline state, a state with lower resistance. Therefore, by controlling the epitaxial thickness 865, the total resistance can be change to be one of a plurality of values between the LRS and HRS or between a structure where the first semiconductor layer 850 material is entirely amorphous or entirely crystalline, respectively. Design of the set pulse determines how much of the first semiconductor layer 850 material epitaxially grows, increases the epitaxial thickness 865, and decreases the total resistance.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial same way, have substantially the same use, and/or perform the similar steps are contemplated as embodiments of this invention.

We claim:

1. A phase change device (PCD) comprising:
a first semiconductor layer made of a first semiconductor material and having a first semiconductor thickness, the first semiconductor layer further having a first interface surface and a first electrode surface, the first interface surface and first electrode surface being on opposite sides of the first semiconductor layer, the first semiconductor material transitioning between a first amorphous state and a first crystalline state at one or more first conditions;
a second semiconductor layer made of a second semiconductor material and having a second semiconductor thickness, the second semiconductor layer further having a second interface surface and a second electrode surface; the second interface surface and second electrode surface being on opposite sides of the second semiconductor layer, the first interface surface and the second interface surface being in electrical, physical, and chemical contact with one another at an interface, and the second semiconductor material transitioning between a second amorphous state and a second crystalline state at one or more second conditions;
a first electrode in physical and electrical contact with the first electrode surface of the first semiconductor layer;
a second electrode in physical and electrical contact with the second electrode surface of the second semiconductor layer; and
a diffusion blocking layer at the interface between the first semiconductor layer and the second semiconductor layer,
wherein the first conditions and second conditions are different.

2. A PCD, as in claim 1, where the first condition is a lower temperature and the second condition is a higher temperature.

3. A PCD, as in claim 2, where the lower temperature and high temperatures are caused by a voltage pulse across the first electrode and the second electrode.

4. A PCD, as in claim 3, where the voltage pulse is a reset pulse that has a voltage magnitude high enough to transition the first semiconductor material transitioning to the first amorphous state without transitioning the second semiconductor material from the second crystalline state.

5. A PCD, as in claim 4, where the reset pulse has a reset pulse fall time fast enough so the first amorphous state does not transition to the first crystalline state.

6. A PCD, as in claim 5, where the all the first semiconductor material is in the first amorphous state and a first resistance across the first semiconductor material in the first amorphous state is greater than the first resistance when part of the first semiconductor material is in the first crystalline state.

7. A PCD, as in claim 6, where the voltage pulse is a set pulse that has a voltage magnitude high enough to transition the first semiconductor material transitioning out of the first amorphous state.

8. A PCD, as in claim 7, where the set pulse has a gradual set pulse fall time slow enough so a first semiconductor crystalline layer epitaxially grows from the interface to split the first semiconductor layer into the first semiconductor crystalline layer with an epitaxial thickness less than the first semiconductor thickness and a first amorphous remainder layer with a remainder thickness.

9. A PCD, as in claim 8, where the epitaxial thickness is determined by the set pulse fall time.

10. A PCD, as in claim 1, where the first semiconductor layer is split into a first semiconductor crystalline layer with an epitaxial thickness less than the first semiconductor thickness and a first amorphous remainder layer with a remainder thickness, and where a first resistance across the first semiconductor material is less than the first resistance when the first semiconductor material is in the first amorphous state and greater than the first resistance when the first semiconductor material is in the first crystalline state.

11. A phase change device (PCD) comprising:
a first semiconductor layer made of a first semiconductor material and having a first semiconductor thickness, the first semiconductor layer further having a first interface surface and a first electrode surface, the first interface surface and first electrode surface being on opposite sides of the first semiconductor layer, the first semiconductor material split into a first semiconductor crystalline layer with an epitaxial thickness less than the first semiconductor thickness and a first amorphous remainder layer with a remainder thickness;
a second semiconductor layer made of a second semiconductor material and having a second semiconductor thickness, the second semiconductor layer further having a second interface surface and a second electrode surface, the second interface surface and second electrode surface being on opposite sides of the second semiconductor layer, the first interface surface and the second interface surface being in electrical, physical, and chemical contact with one another at an interface, and the second semiconductor material transitioning between a second amorphous state and a second crystalline state at one or more second conditions;
a first electrode in physical and electrical contact with the first electrode surface of the first semiconductor layer;
a second electrode in physical and electrical contact with the second electrode surface of the second semiconductor layer; and
a total resistance measured between the first electrode and second electrode.

12. A PCD, as in claim 11, where the total resistance decreases as the epitaxial thickness increases.

13. A PCD, as in claim 11, that can have a plurality of total resistance states by changing the epitaxial thickness.

14. A PCD, as in claim 13, where one of the plurality of total resistance states is selected by a set voltage pulse.

15. A PCD, as in claim 11, where the first semiconductor material is germanium and the second semiconductor material is silicon.

16. A PCD, as in claim 11, where the first semiconductor material is in a first crystalline state and the second semiconductor material is in a second crystalline state.

17. A PCD, as in claim 11, where the first semiconductor material is in a first amorphous state and the second semiconductor material is in a second crystalline state.

18. A PCD, as in claim 11, where the first semiconductor crystalline layer is in a crystalline state and the first amorphous remainder layer is in an amorphous state.

19. A PCD, as in claim 11, where the first semiconductor crystalline layer epitaxially grows from the interface.

* * * * *